United States Patent
Malhotra et al.

(10) Patent No.: US 11,601,134 B2
(45) Date of Patent: Mar. 7, 2023

(54) OPTIMIZED QUANTIZATION FOR REDUCED RESOLUTION NEURAL NETWORKS

(71) Applicant: Robert Bosch GmbH, Stuttgart (DE)

(72) Inventors: Akshay Malhotra, Arlington, TX (US); Thomas Rocznik, Mountain View, CA (US); Christian Peters, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 399 days.

(21) Appl. No.: 16/739,484

(22) Filed: Jan. 10, 2020

(65) Prior Publication Data

US 2021/0218414 A1    Jul. 15, 2021

(51) Int. Cl.
| | | |
|---|---|---|
| *G06N 3/10* | (2006.01) | |
| *G06N 3/08* | (2006.01) | |
| *H03M 7/24* | (2006.01) | |
| *G06F 17/18* | (2006.01) | |
| *G06N 20/00* | (2019.01) | |
| *G06N 5/046* | (2023.01) | |
| *G06F 17/16* | (2006.01) | |
| *G06F 17/15* | (2006.01) | |

(52) U.S. Cl.
CPC ............ *H03M 7/24* (2013.01); *G06F 17/18* (2013.01); *G06N 3/08* (2013.01); *G06N 5/046* (2013.01); *G06N 20/00* (2019.01); *G06F 17/15* (2013.01); *G06F 17/16* (2013.01)

(58) Field of Classification Search
CPC .......... G06F 17/18; G06F 17/15; G06F 17/16; G06N 5/046; G06N 20/00; G06N 3/063; G06N 3/0454; G06N 3/08; G06N 3/04; G06N 3/082; H03M 7/24
See application file for complete search history.

(56) References Cited

U.S. PATENT DOCUMENTS

| | | |
|---|---|---|
| 9,836,692 B1 | 12/2017 | Gulland |
| 2011/0170630 A1* | 7/2011 | Silverman ......... H04L 25/03343 375/296 |
| 2016/0328646 A1* | 11/2016 | Lin ...................... G06V 10/454 |
| 2017/0220929 A1 | 8/2017 | Rozen et al. |

(Continued)

OTHER PUBLICATIONS

Vincent Vanhoucke et al., Improving the Speed of Neural Networks on CPUs, 2011, [Retrieved on Aug. 30, 2022]. Retrieved from the internet: <URL: https://storage.googleapis.com/pub-tools-public-publication-data/pdf/37631.pdf> 8 Pages (1-8) (Year: 2011).*

(Continued)

*Primary Examiner* — Anibal Rivera
(74) *Attorney, Agent, or Firm* — Brooks Kushman P.C.

(57) ABSTRACT

A system and method for generating and using fixed-point operations for neural networks includes converting floating-point weighting factors into fixed-point weighting factors using a scaling factor. The scaling factor is defined to minimize a cost function and the scaling factor is derived from a set of multiples of a predetermined base. The set of possible scaling function is defined to reduce the computational effort for evaluating the cost function for each of a number of possible scaling factors. The system and method may be implemented in one or more controllers that are programmed to execute the logic.

19 Claims, 4 Drawing Sheets

(56) References Cited

U.S. PATENT DOCUMENTS

| | | |
|---|---|---|
| 2019/0012559 A1* | 1/2019 | Desappan ............ G06V 10/764 |
| 2019/0042935 A1 | 2/2019 | Deisher |
| 2021/0174172 A1* | 6/2021 | Qadeer ................ G06N 3/0481 |
| 2021/0174214 A1* | 6/2021 | Venkatesan .............. G06N 3/04 |
| 2021/0209470 A1* | 7/2021 | Sasagawa ............ G06N 3/0454 |
| 2021/0224658 A1* | 7/2021 | Mathew ............... G06N 3/0481 |
| 2021/0264270 A1* | 8/2021 | Liu ........................ G06N 3/063 |
| 2022/0004884 A1* | 1/2022 | Guo .......................... G06F 5/01 |
| 2022/0091821 A1* | 3/2022 | Guo .................... G06F 7/49947 |

OTHER PUBLICATIONS

Christos Louizos et al., Relaxed Quantization for Discretized Neural Networks, Oct. 3, 2018, [Retrieved on Aug. 30, 2022], Retrieved from the internet: <URL: https://arxiv.org/pdf/1810.01875.pdf> 14 Pages (1-14) (Year: 2018).*

Courbariaux et al., "Binarized Neural Networks: Training Neural Networks with Weights and Activations Constrained to +1 or-1", arXiv:1602.02830v3, Mar. 17, 2016, 11 pages.

Rastegari et al., "XNOR-Net: ImageNet Classification Using Binary Convolutional Neural Networks", Allen Institute for Artificial Intelligence, arXiv:1603.05279v4, Aug. 2, 2016, 17 pages.

Choi et al., "Accurate and Efficient 2-BIT Quantized Neural Networks", Proceedings of the 2nd SysML Conference, Palo Alto, CA, USA, 2019, 12 pages.

Li et al., "Ternary weight networks", 1st International (NIPS) Workshop on EMDNN, 2016, arXiv:1605.04711v2, 5 pages.

Zhou et al., "Dorefa-Net: Training Low Bitwidth Convolutional Neural Networks With Low Bitwidth Gradients", arXiv:1606.06160v3, Feb. 2, 2018, 13 pages.

\* cited by examiner

OPTIMIZED QUANTIZATION FOR REDUCED RESOLUTION NEURAL NETWORKS

TECHNICAL FIELD

This application generally relates to a neural network using fixed-point values computations.

BACKGROUND

In recent years, a majority of machine learning-based breakthroughs in the field of computer vision and voice processing/recognition were achieved by using deep learning approaches. The task of classifying input data using these deep learning-based classifiers has been extensively studied and used for many different applications. Based on the application, the neural network required for classification may be extremely large with several tens of millions of variables. Such large networks require significant computation and data storage resources and consequently have a high energy/power footprint. Due to the high resource requirements, many deep learning tasks are mainly done in the cloud (most of the computations are either performed on GPUs or special hardware such as neuronal network accelerators). Owing to the computation and power constraints, in many cases the deep learning networks cannot be deployed in resource constrained settings. The latest trend is to extend the application areas from imagers and phones to other kind of sensors (e.g., inertial sensors). These sensors can be part of wearable devices without a permanent cloud connection due to battery lifetime restrictions—so called edge computing. Thus, novel concepts for local classifications on edge devices are needed.

SUMMARY

A method for converting floating-point weighting factors to fixed-point weighting factors for a neural network includes selecting a predetermined number of candidate scaling factors that are multiples of a predetermined base. The method includes evaluating each of the candidate scaling factors in a cost function. The method includes selecting a scaling factor as a one of the candidate scaling factors that results in a minimum value of the cost function. The method includes generating the fixed-point weighting factors by scaling the floating-point weighting factor using the scaling factor. The method includes operating the neural network using the fixed-point weighting factors.

The predetermined base may be two. The method may further include, responsive to completing a training stage for the neural network, providing the fixed-point weighting factors to an inference stage. The predetermined number of candidate scaling factors may include a greater number of candidates having a value that exceeds a mean value of an absolute value of the floating-point weighting factors. The predetermined number of candidate scaling factors may include only one candidate that is less than a mean value of absolute values of the floating-point weighting factors. The cost function may be a mean square error between the floating-point weighting factors and a product of the candidate scaling factors and corresponding fixed-point weighting factors. The method may further include updating the scaling factor during a training stage of a neural network after a predetermined number of training intervals.

A machine learning system includes a controller programmed to convert floating-point weighting factors for a neural network into fixed-point weighting factors using a scaling factor that is a multiple of a predetermined base, b, and that minimizes a cost function that is a mean square error between the floating-point weighting factors and a product of candidate scaling factors and corresponding fixed-point weighting factors, and, after a predetermined number of iterations during a training stage, change the scaling factor.

The controller may be further programmed to implement the neural network using fixed-point operations. The candidate scaling factors may include first and second candidate values having exponents L and L−1, respectively, such that a mean of absolute values of the floating-point weighting factors is between $b^L$ and $b^{L-1}$. The controller may be further programmed to evaluate the cost function with candidate scaling factors that are multiples of the predetermined base from $b^{L-1}$ to $b^{L+4}$. The controller may be further programmed to evaluate the cost function for a first number of candidate scaling factors that are greater than a mean of absolute values of the floating-point weighting factors and for a second number of candidate scaling factors that are less than the mean, the first number being greater than the second number. The controller may be further programmed to, after completion of the training stage, provide the fixed-point weighting factors to an inference stage that is configured to implement a neural network. The predetermined base, b, may be two. The controller may be further programmed to define the scaling factor for a layer that includes more than one node.

A method includes selecting a predetermined number of candidate scaling factors that are multiples of two and evaluating, for each of the candidate scaling factors, a cost function that is a mean square error between a predetermined set of floating-point weighting factors for a neural network and a product of a candidate scaling factors being evaluated and fixed-point weighting factors defined by the candidate scaling factor being evaluated. The method includes selecting a scaling factor as a one of the candidate scaling factors that results in a minimum value of the cost function and generating a set of fixed-point weighting factors by scaling each of the floating-point weighting factors by the scaling factor. The method includes implementing the neural network using the set of fixed-point weighting factors.

The candidate scaling factors may include first and second candidate values having exponents L and L−1, respectively, such that a mean of absolute values of the predetermined set of floating-point weighting factors is between $2^L$ and $2^{L-1}$. The candidate scaling factors may include multiples of two from $2^{L-1}$ to $2^{L+4}$. The candidate scaling factors may include a greater number of candidate scaling factors that are greater than a mean of absolute values of the floating-point weighting factors than are less than the mean. The predetermined set may correspond to a node of the neural network.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Machine-learning systems are being incorporated into a variety of modern systems. Machine-learning systems are attractive as the systems may be trained or adapted to different situations. For example, by applying a training dataset to the machine-learning algorithm, the system may adjust internal weighting factors to achieve the expected result. The training dataset may include a set of inputs to the machine-learning algorithm and a corresponding set of expected outputs of the machine-learning algorithm. During training, the system may monitor an error between the expected outputs and the actual outputs generated by the machine-learning algorithm to adjust or calibrate weighting factors within the machine-learning algorithm. The training may be repeated until the error falls below a predetermined level.

The machine learning system may be part of a larger application or system. For example, the machine learning system may be incorporated into a robotic application. In other examples, the machine learning system may be part of a vision system. For example, the machine learning system may be trained to identify particular objects in a field of view from video images. The machine learning system may be further configured to provide a control signal for controlling a device (e.g., robotic arm).

A neural network may be used as part of a machine-learning system. The neural network may be comprised of different interconnected stages between the inputs and the outputs. Neural networks may include a sequence encoder layer, a prototype layer, and a fully connected layer. In addition, the neural network may include one or more convolutional layers for feature extraction. The neural network may be implemented on an embedded controller having finite memory and processing resources. As such, there may be limits on the number of computations per time interval that may be performed. As the neural networks increase in size and number, the computation resources may be strained. That is, there may be not be enough processing time to complete the computations in the desired time interval. As such, methods for decreasing the computational load may be helpful.

The main limiting factor for practical deployment in resource-constrained settings is the precision at which the weights have to be maintained. Precision of neural network weights may have a direct impact on the network performance and are thus usually maintained as floating-point values. The math operations relating to these weights are consequently performed in floating point precision too. Floating-point variables may require more memory space than fixed-point variables. In addition, operations on floating-point variables typically require more processor cycles than operations on fixed-point variables. Note that the above discussion regarding weights may also apply to the inputs and outputs of the nodes/neurons. The strategies disclosed herein are applicable to any system having a set of coefficients or factors.

The above observations may present some paths for improving the performance of neural networks. A first improvement may be to store the variables/data in a reduced-precision fixed-point representation. A second improvement may be to perform math operations in fixed-point arithmetic. Thus, both data and variables can be maintained as fixed-point values with a lower number of bits (1 to 8), thereby reducing the storage and computation complexities.

Figure 1:
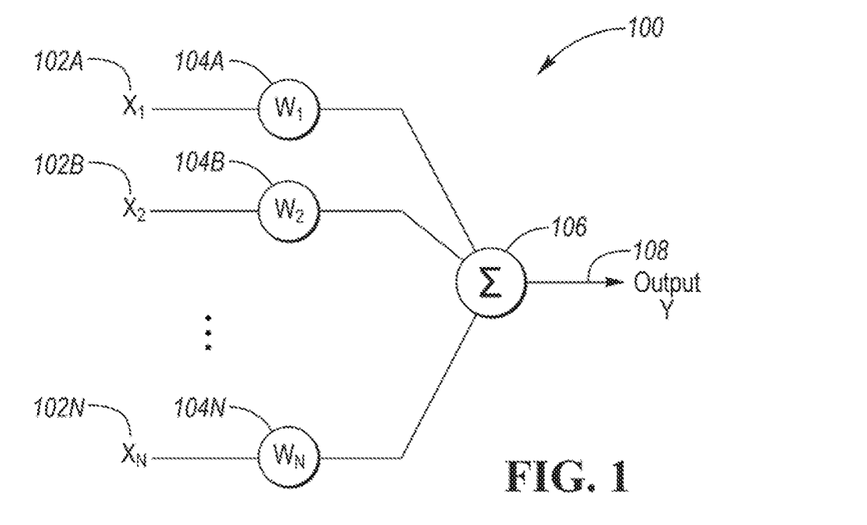
FIG. 1 depicts an example of a single node of a neural network.

Generally, all the variables of the neural network and its inputs are represented in floating point (which requires 16/32/64 bits based on the processor and another variable to store the position of the decimal). Consequently, the corresponding math operations are also performed in floating point. This requires a considerable storage and processing overhead. For example, the operations to evaluate the outputs of a single node in a fully connected layer of a neural network can be represented as shown in FIG. 1. FIG. 1 depicts an example of a single node 100 of a fully-connected layer. The node 100 may be configured to sum a plurality of weighted input values to generate an intermediate output value 108. Each of the input values 102 may be multiplied by a corresponding weighting factor 104. The product of each of the input values 102 and the weighting factors 104 may be fed into a summing element 106 and added together. In a typical implementation, each of the input values 102, the weighting factors 104, and the intermediate output value 108 may be implemented as floating-point values. Note that the corresponding neural network layer may be comprised of many of these nodes. The intermediate output value 108 may be passed through an activation function to generate a final output and may introduce nonlinear behavior. For example, a rectified linear unit (RELU) may be applied as the activation function to generate the final output. The configuration depicted in FIG. 1 may represent other elements of a neural network. For example, the diagram of FIG. 1 may represent any structure having weighting factors applied to inputs and fed into a summation element.

It may be beneficial to consider the case in which the inputs 102 are already in fixed-point precision. Note that in cases in which the inputs 102 are expressed in floating-point representation, the strategies disclosed herein may be applied to convert the values to fixed-point representation. Then, the quantization process to represent the weights in fixed-point precision (using k bits) can be expressed in two stages. The first stage may be to find a factor, a, to scale the data to a reduced range (e.g., [−1 to 1]) as follows:

$$w_{temp} = \frac{w}{a} \tag{1}$$

The second stage may be to split the range into n intervals, where $n=2^k-1$ and a quantized/fixed-point scaling factor may be expressed as:

$$w_q = \text{round}(w_{temp}(2^k - 1)) * \frac{1}{2^k - 1} \quad (2)$$

The second stage can be performed such that the intervals are all the same size (linear quantization) or of different size (non-linear quantization). Since, the objective is to perform math operations post quantization, linear quantization is more common. The value of k may represent the number of bits that are used to express the weight value as an integer or fixed-point value. The fixed-point weighting factors may be derived by scaling each of the floating-point weighting factors by the scaling factor, a. In this example, the scaling occurs by dividing the floating-point weighting factors by the scaling factor.

In this example, linear quantization may be used. To effectively express the values using fixed-point variables, the scaling factor a may be appropriately selected. The scaling factor a may be selected such that the quantized weights are as close as possible to the original floating-point weights in a mean square sense. The following cost function may be minimized:

$$\text{Cost:minimize} |w - aw_q|_2 \, w.r.t. \, a \quad (3)$$

where, w represents the original weights, $w_q$ represents the quantized weights, and a is the scaling factor. The cost function may be described as a mean square error between the floating-point weighting factors (w) and a product of candidate scaling factors and corresponding fixed-point weighting factors ($a*w_q$).

Thus, during the quantization of the weights of a layer (to k-bits), one of the main operations that impacts the quantization loss in equation (3) involves the scaling of the weights. Multiple different approaches are available to solve this optimization problem.

Many approaches are applied to the weighting factors after training of the neural network is completed. These strategies may maintain the overhead of the floating-point representation during the training process. A first approach is that of a Binary Neural Network. This approach focuses on 1-bit neural networks (k=1). The approach adopts the simplistic approach of considering a=1. Thus the resultant weights are quantized just based on their sign as:

$$w_q = \text{sign}(w) \quad (4)$$

A second approach may be an exclusive-NOR logic (XNOR). This approach again primarily focuses on 1-bit networks, but the same strategy is applicable for a larger number of bits as well. This approach solves the optimization problem in equation (3) for the 1-bit case under the assumption that the weights are Gaussian distributed. The closed form solution is derived as $a=E(|w|)$, which is the mean of the absolute values of all weights in a layer.

A third approach is a Ternary Weight Network (TWN) method. This approach uses three levels for quantization, $\{-a, 0, a\}$. The scaling factor may be selected as in the XNOR method as $a=E(|w|)$.

A fourth approach may be a statistics-aware weight binning (SAWB) approach. This approach may be applied for more than 1-bit (k>1). Instead of using a factor dependent just on the first-order statistics of the data, second-order statistics are applied as well. The approach uses a heuristic method derived by assuming that the weights can come from a fixed set of probability distributions. The scaling factor in this approach may be given by:

$$a = c_1 E[(w)^2]^{1/2} - c_2 E[|w|] \quad (5)$$

Where $c_1$ and $c_2$ are experimentally found and are fixed for a given value of k. The above-described approaches are applied post-training. That is, the training process is completed to learn the entire set of weights before the scaling factor is determined and the weights are quantized. As such, benefits of the fixed-point representation are not realized during the training process.

Figure 2:
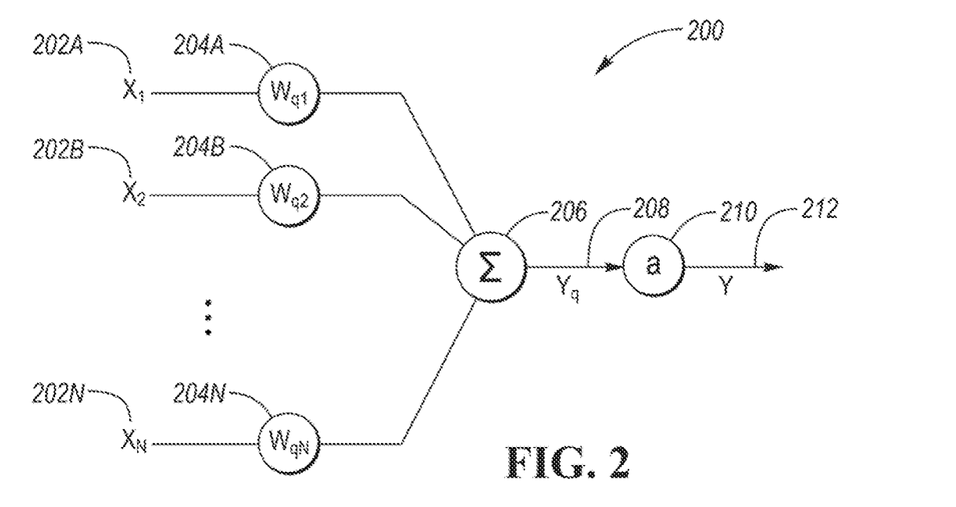
FIG. 2 depicts an example of a single node of a neural network using a fixed-point resolution.

The operation of a single node 200 for evaluating the output of a neural network layer is depicted in FIG. 2. The node 200 may include fixed-point inputs 202. The fixed-point inputs 202 are values that are expressed in integer or fixed-point notation. The node 200 further includes a plurality of fixed-point weighting factors 204 ($W_{q1}, \ldots W_{qN}$). The fixed-point weighting factors 204 may be derived as described above. The node 200 includes a summing block or function 206 that is configured to sum the products of corresponding fixed-point inputs 202 and fixed-point weighting factors 204. The output of the summing block 206 may be a fixed-point output 208. The output of the summing block may be expressed as:

$$\sum_{i=1}^{N} w_{qi} x_i \quad (6)$$

The discretized weighting factors 204 may be defined as:

$$[w_{q1}, w_{q2}, \ldots w_{qN}] = Q([w_1, w_2, \ldots w_N]) \quad (7)$$

The fixed-point weighting factors 204 may be derived from a quantization function, Q, applied to the original floating-point weighting factors. The quantization function may be as described above.

The fixed-point output 208 may be multiplied by a scaling factor 210 (shown as a) to generate a node output 212 as follows:

$$\left(\sum_{i=1}^{N} w_{qi} x_i\right) a \quad (8)$$

The node output 212 may be represented as a floating-point value. The fixed-point output 208 is multiplied by the scaling factor, a, 210 to bring the node output 212 to the actual scale. Note that there may be an additional activation function that is applied.

The quantization strategy may be configured to reduce the number of floating-point multiplications and divisions by selecting a scaling factor that is a multiple of two. By forcing the scaling factor to a multiple of two, multiplication and division operations involving the scaling factor can be performed by shift operations in a microprocessor. Shift operations generally execute faster and/or more efficient than floating-point operations in a microprocessor. The optimization problem of equation (3) may be solved to provide more robust solutions than using heuristics functions developed based on example data or designed for specific distributions. The specific problem may then be to determine which multiple of two should be selected as the scaling factor.

A batch may be defined as a group of training samples or a training set that is applied to the neural network. During training, the weighing factors may be updated after each batch is processed. A batch may result in a number of iterations through the neural network. A batch update may be an update of the weighting factors after a predetermined number of training samples are processed. A strategy that updates the scaling factor after every batch of training samples may unnecessarily utilize computing resources. For example, the scaling factor is unlikely to change as quickly as the weighting factors during the training due to the discretized nature of the scaling factor. As such, the scaling factor may be changed after a predetermined number of batches are processed during the training phase. The predetermined number of batches may depend on the set of training data and the application. The weighting factors may be updated more frequently than the scaling factor. For example, the scaling factor may be updated once for a predetermined number (e.g., 2-100) of updates for the weighting factors.

A first step is in identifying a scaling factor, a, that improves the weight quantization process. To accomplish this, the optimization problem in equation (3) may be solved to select the scaling factor, a. However, the optimization problem in equation (3) may not be solved to the global minima since it is non-convex and non-smooth. For example, this may occur when there is a large space for the scaling factor while also optimizing the weights. The alternative is a brute-force search for the scaling factor after each batch. Thus, iterating over infinite values of the scaling factor, a, is not a feasible option. This is the primary reason why existing methods have relied on developing heuristics functions to estimate the scaling factor, a.

The approach disclosed herein is to solve the problem in equation (3) over a finite set of candidate scaling factors S during training after a predetermined number of batch updates. The finite set of candidate scaling factors may be restricted to be multiples of two:

$$S=\{2^n, \ldots, 2^m\} \qquad (9)$$

Since the set is defined to have only a finite number of values (e.g., 10-20), the cost in equation (3) can be evaluated for each member of the set. The value of the scaling factor that minimizes the cost may be selected for quantizing the weights. The scaling factor can potentially be the same for all the layers or different for each layer or different for each kernel or neuron of a layer. While it may be more common to utilize a single scaling factor for each layer, using a different factor for each kernel or neuron is also acceptable. The strategy may be applied to any configuration in which a set of coefficients are to be discretized. For example, a kernel may describe a set of coefficients for a filter for a convolutional layer. The disclosed strategies may be applied to the coefficients to generate a set of fixed-point coefficients.

As the scaling factor, a, may be selected as a multiple of two, the scaling operation in equation (1) and the inverse-scaling/rescaling operation shown in FIG. 2 can be performed using shift operations and does not use a floating-point multiplier as in existing schemes. Thus, the set of operations represented in FIG. 2, do not use any floating-point multiplication. This results in a major cost savings depending upon the neural network size, and across all layers of the network, there may be several tens of thousands to several million of such operations. This may be beneficial during the training stage and during the inference stage when implemented in a real-time system.

As the scaling factors selected by the proposed approach may be multiples of two, updating the weights does not affect the set optimal scaling factor at every iteration/batch during the training phase. Therefore, it is not necessary to evaluate equation (3) over S at each batch/iteration. Thus, the scaling factor, a, can be selected and the cost function minimized once every predetermined number (e.g., 10-100) of batches. Thus, even though the complexity of evaluating the candidate scaling factors over a single update may be greater than the existing approaches, averaged over several tens of iterations it is much lower and represents another advantage of the disclosed method. Also, it should be remembered that the iterative update of the scaling factor is required only during the training stage. During the inference stage, the scaling factors learned during training are used for the different layers and are not updated.

As described, the cost function may be minimized by evaluating the cost function for each candidate scaling factor. The scaling factor is then selected as that candidate scaling factor that minimizes the cost function. Another aspect by which the complexity of identifying the scaling factor, a, may be reduced is by reducing the number of candidate scaling factors of the set S. It can be proven for many common distributions (e.g., Linear and Gaussian) that the scaling factor, a, should satisfy the following condition: a>M=mean(abs(W)). Therefore, the set S may be selected such that there are more candidate elements greater than the mean and fewer candidate elements that are less than the mean. The set of candidate scaling factors may be defined as $$S=\{2^{\overline{m}-1}, \ldots, 2^{\overline{m}+4}\}, \text{ where } 2^{\overline{m}} \cong M \qquad (10)$$

The above defined set was used in experiments and was found to be effective. However, it is understood that the described method is not limited to this range. The number of candidate scaling factors may include a greater number of candidates having a value that exceeds the mean value of an absolute value of the set of floating-point weighting factors. The number of candidate scaling factors may include only one candidate that is less than the mean value of the absolute values of the set of floating-point weighting factors.

Although the scaling factor is reasonably defined as a multiple of two, scaling factors which are a multiple of any other number, for example, p∈{Real Integers}, are also in the scope of this disclosure. The scaling factor may be a multiple of a predetermined base other than two. For example, if an embedded system uses tristate signals, the scaling factor, a, can be optimized using the set:

$$S=\{3^{\overline{m}-1}, \ldots, 3^{\overline{m}+4}\}, \text{ where } 3^{\overline{m}} \cong M \qquad (10)$$

This may be further generalized to any predetermined base, b, as:

$$S=\{b^{\overline{m}-1}, \ldots, b^{\overline{m}+4}\}, \text{ where } b^{\overline{m}} \cong M \qquad (11)$$

Since the optimization problem in equation (3) is solved for a reduced set of candidate scaling factors and no assumptions regarding the probability distribution of the weights are made, the performance of the method remains reliable even if the underlying weights originate from some random distribution. Thus, the scheme has a much wider applicability compared to existing heuristic or distribution specific approaches.

Figure 3:
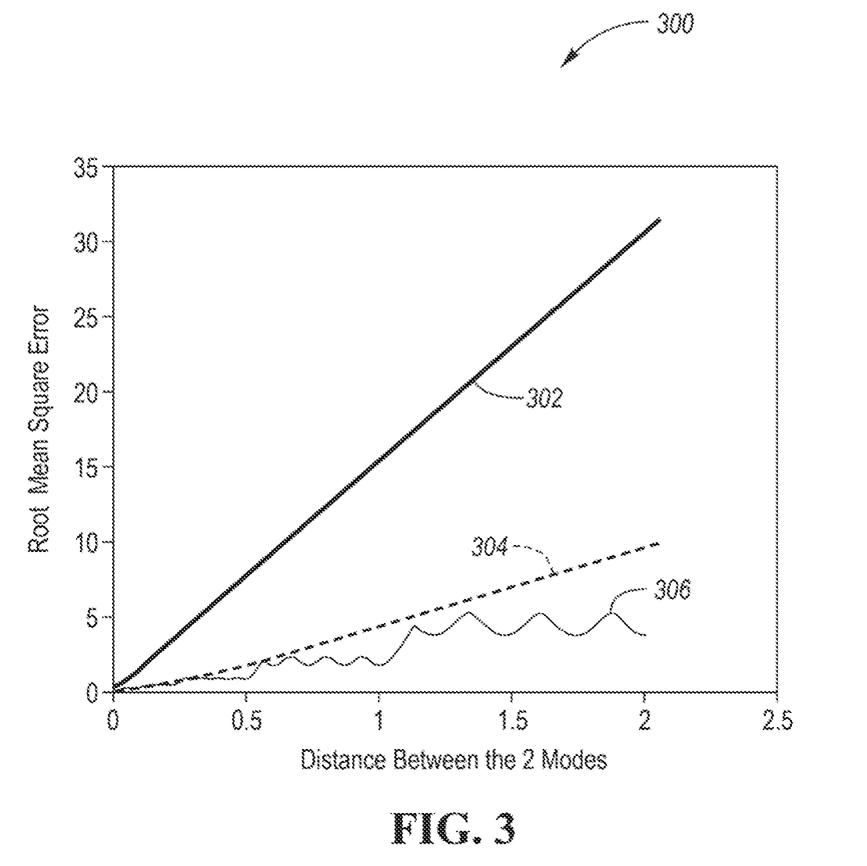
FIG. 3 depicts graphs showing the accuracy associated with different weighting factor conversion strategies.

FIG. 3 depicts an example plot for bimodal distributions showing the change in root mean square error (RMSE) against the distance between the two modes, for three different methods. Both the modes are gaussian with a standard deviation of 0.02. A first curve 302 depicts the performance of the XNOR algorithm used by XNOR. A second curve 304 depicts the performance of a second strategy. A third curve 306 depicts the performance of the method introduced herein. One can see that the error for most bimodals is much lower for proposed method than for the other strategies.

The above mentioned method learns a scaling factor, a, (which is a multiple of two (or any other base)) for each layer of a neural network (or for the complete net or a section of the network) during training and is the optimal scaling factor in a set of multiple of twos.

The scaling factor, a, proposed reduces computation complexity as it may remain stationary for several batch updates during the training state and can be updated less frequently. Also, since the proposed scaling factor may be a multiple of two, its implementation for quantization is hardware friendly.

The scaling factor, a, obtained from the method above is robust to changes in probability density of weights (as seen from FIG. 3) and is designed, and thus applicable, irrespective of the underlying distribution.

Figure 4:
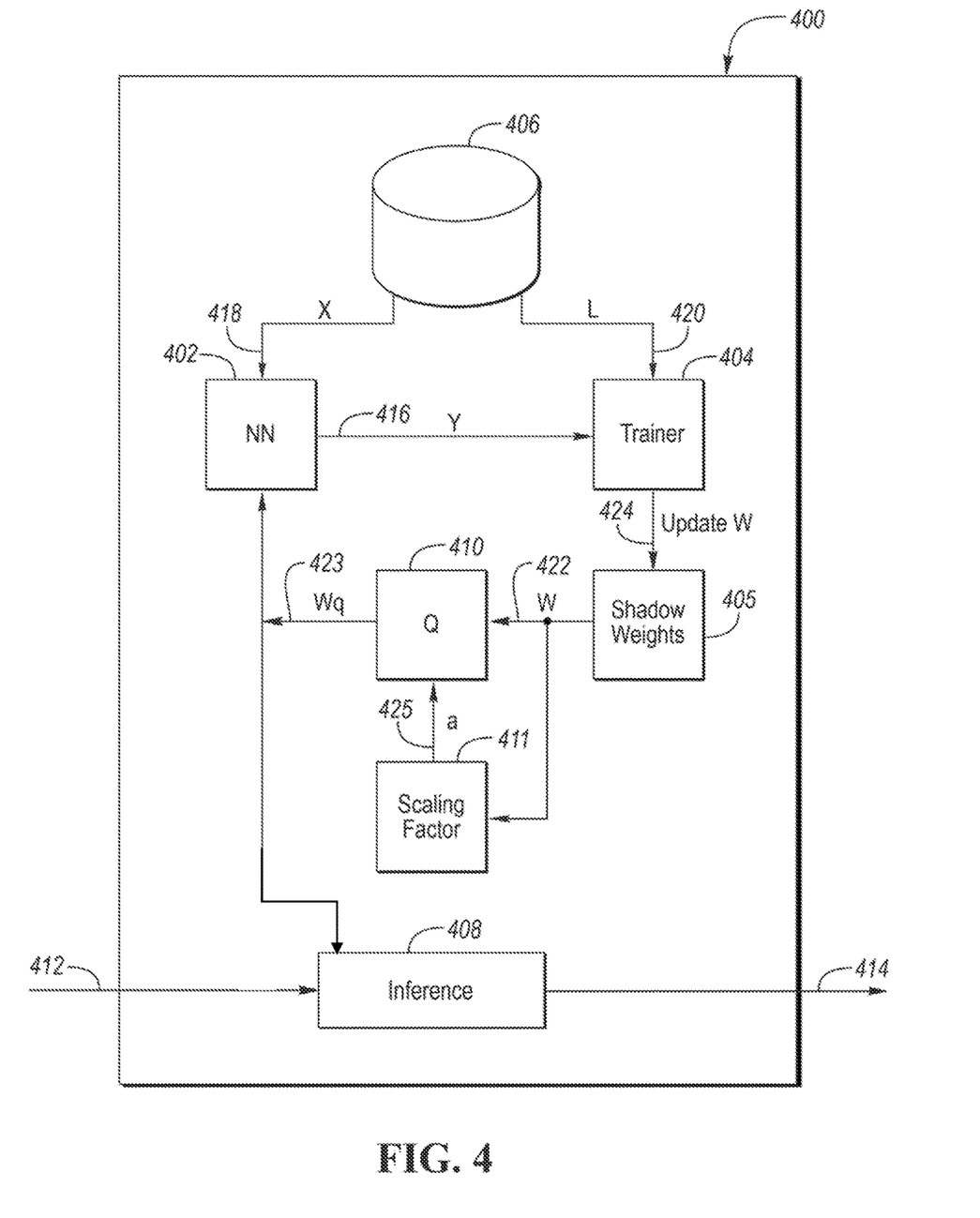
FIG. 4 depicts a possible block diagram of a machine learning system.

FIG. 4 depicts a block diagram for a possible machine learning system 400. The machine learning system 400 may be implemented in one or more controllers. The controllers may include a processor configured to execute instructions. The controllers may further include volatile and non-volatile memory for storing programs and data. In configurations with multiple controllers, the controllers may include circuitry and software for communicating with one another over a communication channel (e.g., Ethernet or other).

The machine learning system 400 may include a neural network 402. The neural network 402 may include multiple layers and be comprised of a plurality of nodes and/or kernels as described above. The machine learning system 400 may include a trainer 404. The trainer 404 may perform operations for training the neural network 402. The machine learning system 400 may include a training database 406 that includes a set of inputs and corresponding outputs or labels for the neural network 402. The training database 406 may include the expected outputs for each set of inputs to the neural network 402. The trainer 404 may coordinate application of inputs and outputs of the training database 406. For example, the trainer 404 may cause the neural network 402 to process a batch of input data 418 and output updated weighting factors 424 after the batch has been processed. The neural network 402 may receive the input data 418 from the training database 406. The trainer 404 may receive expected output data 420 from the training database 406. The neural network 402 may process the input data 418 to generate output data 416 according to the neural network strategy. For example, the neural network 402 may include a plurality of nodes and/or kernels or some combination thereof. The trainer 404 may receive the output data 416 from the neural network 402 for comparison with the expected output data 420. The neural network may operate on the input data 418 using a set of fixed-point weighting factors 423.

The trainer 404 may monitor the performance of the neural network 402. When the output data 416 does not closely correlate to the expected output data 420, the trainer 404 may generate the weighting factor adjustments 424. Various known strategies are available for adjusting the weighting factors. The trainer 404 may iterate through the training data until the output data 416 is within a predetermined range of the expected output data 420. When the error is less than a predetermined threshold, the training stage may be completed. The weighting factor adjustments 424 may be input to a shadow weight function 405. The shadow weight function 405 may maintain a set of weighting factors for the neural network 402 in full-precision. The output of the shadow weight function 405 may be a set of full-precision weighting factors 422. For example, the full-precision weighting factors 422 may be represented as floating-point variables.

The machine-learning system 400 may further include a quantizer 410 that is configured to convert the full-precision weighting factors 422 learned during the training stage to the fixed-point weighting factors 423 used in the neural network 402. For example, the quantizer 410 may apply equations (1) and (2) to generate the fixed-point weighting factors 423. The fixed-point weighting factors 423 may be provided to the neural network 402 during the training stage. The quantizer 410 may use the scaling factor that is determined as described above. During the training phase, the quantizer 410 may continually convert the full-precision weighting factors 422 to the fixed-point weighting factors 423 at each iteration. The fixed-point weighting factors 423 may be generated using a scaling factor 425 that is currently provided.

The machine-learning system 400 may further include a scaling factor determination function 411 that is configured to generate the scaling factor, a, 425 for the quantizer 410. For example, the scaling factor determination function 411 may be performed periodically during the training stage. For example, the scaling factor determination function 411 may be performed every tenth batch or iteration of the training stage. In more general terms, the scaling factor determination function 411 may be performed after a predetermined number of batches or iterations during the training stage. The scaling factor determination function 411 may include selecting a predetermined set of candidate scaling factors to evaluate in the cost function. The scaling factor determination function 411 may further include evaluating each of the candidate scaling factors in the cost function to determining the one of the scaling factors 425 that minimizes the cost function. The scaling factor determination function 411 may output the scaling factor, a, 425 to the quantizer 410. The quantizer 410 may output the fixed-point weighting factors 423 for use by the neural network 402. After the training stage is completed, the fixed-point weighting factors 423 may be provided to the inference stage 408. Using the fixed-point weighting factors 423 during the training stage may improve the performance of the training operation. While the training stage may still utilize some floating-point operations for maintaining the full-precision weighting factors 422, fewer floating-point operations are used in the neural network 402. Another advantage is that the same fixed-point weighting factors 423 are used in the training stage (in the neural network 402) and the inference stage 408. During the training stage, the fixed-point weighting factors 423 may change at each iteration or batch as the full-precision weighting factors 422 are updated. After a predetermined number of batches or iterations, the scaling factor 425 may be updated to change the scaling operation of the quantizer 410.

The inference stage 408 may implement the neural network algorithm as part of a real-time system. As such, the neural network may be implemented in an optimal manner for real-time operation. The inference stage 408 may receive actual inputs 412 and generate actual outputs 414 based on the operation of the neural network. The actual inputs 412 may be from sensor inputs. The inference stage 408 may be incorporated into a real-time system to process a set of input data. For example, the inference stage 408 may be incorporated into a machine-vision system and be configured to identify particular objects in an image frame. In the inference stage, the weighting factors of the neural network may be maintained at the fixed-point values that were learned during the training stage.

Figure 5:
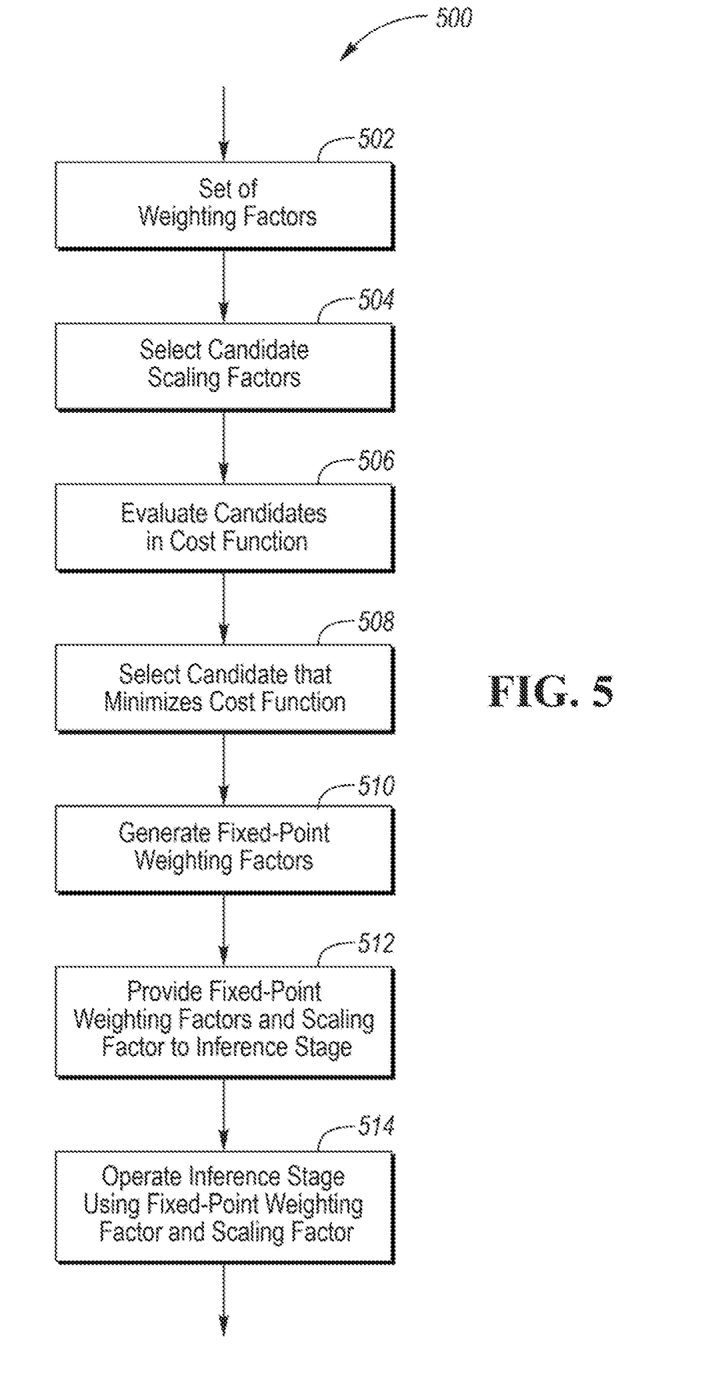
FIG. 5 depicts a possible flow chart for selecting a scaling factor for converting weighting factors to fixed-point representation.

As the inference stage 408 may be a real-time system, it may be desired to use fixed-point or integer operations at runtime. As such, the inference stage 408 may be configured to operate using fixed-point or integer operations to improve computational throughput. The inference stage 408 may include logic for processing the layers and nodes. FIG. 5 depicts a possible flowchart 500 for a set of operations for converting floating-point weighting factors of a neural network to a fixed-point representation. At operation 502, a set of weighting factors may be generated. The set of weighting factors may be generated during the training stage and may correspond to one or more elements of the neural network (e.g., node, neuron, kernel, layer). The weighting factors may be represented as floating-point values at this stage. The set of weighting factors may correspond to a group of nodes or an entire layer of the neural network. The set of weighting factors may be an output of the training operation and may be updated after one or more iterations of the training stage.

At operation 504, a set of candidate scaling factors may be selected. A predetermined number of candidate scaling factors may be chosen. The candidate scaling factors may be multiples of a predetermined base (e.g., two). The candidate scaling factors may include a greater number of candidates having a value that exceeds a mean value of an absolute value of the floating-point weighting factors. The mean value may be of a set of weighting factors associated with a node or layer. The candidate scaling factors may include only one candidate that is less than a mean value of the absolute values of the floating-point weighting factors. The candidate scaling factors may include first and second candidates having exponents L and L−1, respectively, such that a mean of the absolute values of the set of floating-point weighting factors is between $b^L$ and $b^{L-1}$. The candidate scaling factor may include those multiples of the predetermined base from $b^{L-1}$ to $b^{L+4}$. It may be useful to minimize the number of candidate scaling factors to reduce execution time for evaluating the cost function.

At operation 506, the candidate scaling factors may be evaluated in the cost function. The cost function may be a mean square error between the set of floating-point weighting factors and a product of the candidate scaling factors being evaluated and the fixed-point weighting factors defined by the candidate scaling factor being evaluated. The cost function may be expressed as equation (3) above.

At operation 508, the candidate scaling factor that minimizes the cost function may be selected. Each candidate scaling factor may be evaluated in the cost function to determine a numerical value for comparison. For example, the cost function may be evaluated for each candidate scaling factor to generate a numerical value. The numerical values may be then be compared to determine the minimum value.

At operation 510, fixed-point weighting factors may be generated using the selected scaling factor. For example, the fixed-point weighting factors may be generated by using equations (1) and (2) above. Operation 502 through operation 510 may be repeated periodically during the training phase. After completion of the training phase, the final set of quantized weighting factors may be available for the inference stage.

At operation 512, the fixed-point weighting factors and scaling factor may be provided to the inference stage. The fixed-point weighting factors and the scaling factor may be transferred via a communication channel in configurations in which the inference stage is implemented in a separate controller. At operation 514, the fixed-point weighting factors and the scaling factor may be used during operation of the inference engine.

The system and methods disclosed herein present an improved way of quantizing weighting factors for neural networks. The method can generate scaling factors that minimize a cost function. The method further reduces the number of candidate scaling factors that are to be evaluated in the cost function and reduces computational overhead for converting the weighting factors.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:
1. A machine learning system comprising:
at least one controller including a hardware processor, wherein the at least one controller is programmed to convert floating-point weighting factors for a neural network into fixed-point weighting factors using a scaling factor that is a multiple of a predetermined base, b, and that minimizes a cost function that is a mean square error between the floating-point weighting factors and a product of candidate scaling factors and corresponding fixed-point weighting factors, and, after a predetermined number of iterations during a training stage, change the scaling factor.

2. The machine learning system of claim 1, wherein the controller is further programmed to implement the neural network using fixed-point operations.

3. The machine learning system of claim 1, wherein the candidate scaling factors include first and second candidate values having exponents L and L−1, respectively, such that a mean of absolute values of the floating-point weighting factors is between $b^L$ and $b^{L-1}$.

4. The machine learning system of claim 3, wherein the controller is further programmed to evaluate the cost function with candidate scaling factors that are multiples of the predetermined base from $b^{L-1}$ to $b^{L+4}$.

5. The machine learning system of claim 1, wherein the controller is further programmed to evaluate the cost function for a first number of candidate scaling factors that are greater than a mean of absolute values of the floating-point weighting factors and for a second number of candidate scaling factors that are less than the mean, the first number being greater than the second number.

6. The machine learning system of claim 1, wherein the controller is further programmed to, after completion of the training stage, provide the fixed-point weighting factors to an inference stage that is configured to implement a neural network.

7. The machine learning system of claim 1, wherein the predetermined base, b, is two.

8. The machine learning system of claim 1, wherein the controller is further programmed to define the scaling factor for a layer that includes more than one node.

9. A method comprising:
selecting a predetermined number of candidate scaling factors that are multiples of two;
evaluating, for each of the candidate scaling factors, a cost function that is a mean square error between a predetermined set of floating-point weighting factors for a neural network and a product of a candidate scaling factors being evaluated and fixed-point weighting factors defined by the candidate scaling factor being evaluated;
selecting a scaling factor as a one of the candidate scaling factors that results in a minimum value of the cost function;
generating a set of fixed-point weighting factors by scaling each of the floating-point weighting factors by the scaling factor; and
implementing the neural network using the set of fixed-point weighting factors.

10. The method of claim 9, wherein the candidate scaling factors include first and second candidate values having exponents L and L−1, respectively, such that a mean of absolute values of the predetermined set of floating-point weighting factors is between $2^L$ and $2^{L-1}$.

11. The method of claim 10, wherein the candidate scaling factors include multiples of two from $2^{L-1}$ to $2^{L+4}$.

12. The method of claim 9, wherein the candidate scaling factors include a greater number of candidate scaling factors that are greater than a mean of absolute values of the floating-point weighting factors than are less than the mean.

13. The method of claim 9, wherein the predetermined set corresponds to a node of the neural network.

14. A method for converting floating-point weighting factors to fixed-point weighting factors for a neural network, the method comprising:
selecting a predetermined number of candidate scaling factors that are multiples of a predetermined base, wherein the predetermined number of candidate scaling factors includes a greater number of candidates having a value that exceeds a mean value of an absolute value of the floating-point weighting factors;
evaluating each of the candidate scaling factors in a cost function;
selecting a scaling factor as a one of the candidate scaling factors that results in a minimum value of the cost function;
generating the fixed-point weighting factors by scaling the floating-point weighting factor using the scaling factor; and
implementing the neural network using the fixed-point weighting factors.

15. A method for converting floating-point weighting factors to fixed-point weighting factors for a neural network, the method comprising:
selecting a predetermined number of candidate scaling factors that are multiples of a predetermined base, wherein the predetermined number of candidate scaling factors includes only one candidate that is less than a mean value of absolute values of the floating-point weighting factors associated;
evaluating each of the candidate scaling factors in a cost function;
selecting a scaling factor as a one of the candidate scaling factors that results in a minimum value of the cost function;
generating the fixed-point weighting factors by scaling the floating-point weighting factor using the scaling factor; and
implementing the neural network using the fixed-point weighting factors.

16. A method for converting floating-point weighting factors to fixed-point weighting factors for a neural network, the method comprising:
selecting a predetermined number of candidate scaling factors that are multiples of a predetermined base;
evaluating each of the candidate scaling factors in a cost function;
selecting a scaling factor as a one of the candidate scaling factors that results in a minimum value of the cost function;
generating the fixed-point weighting factors by scaling the floating-point weighting factor using the scaling factor, wherein the cost function is a mean square error between the floating-point weighting factors and a product of the candidate scaling factors and corresponding fixed-point weighting factors; and
implementing the neural network using the fixed-point weighting factors.

17. The method of claim 16, wherein the predetermined base is two.

18. The method of claim 16, further comprising:
responsive to completing a training stage for the neural network, providing the fixed-point weighting factors to an inference stage.

19. The method of claim 16, further comprising:
updating the scaling factor during a training stage of a neural network after a predetermined number of training intervals.

* * * * *